United States Patent
Kajigaya

(10) Patent No.: US 7,317,649 B2
(45) Date of Patent: Jan. 8, 2008

(54) SEMICONDUCTOR STORAGE DEVICE

(75) Inventor: Kazuhiko Kajigaya, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/393,666

(22) Filed: Mar. 31, 2006

(65) Prior Publication Data

US 2006/0221755 A1 Oct. 5, 2006

(30) Foreign Application Priority Data

Mar. 31, 2005 (JP) .............................. 2005-104310

(51) Int. Cl.
*G11C 7/00* (2006.01)
(52) U.S. Cl. .................. 365/222; 365/230.03; 365/207
(58) Field of Classification Search ................ 365/222, 365/207, 230.03
See application file for complete search history.

(56) References Cited

U.S. PATENT DOCUMENTS

| | | | |
|---|---|---|---|
| 5,691,933 A * | 11/1997 | Takenaka | 365/63 |
| 5,812,478 A * | 9/1998 | Okamura | 365/230.03 |
| 2003/0112690 A1 * | 6/2003 | Tsukada | 365/222 |

FOREIGN PATENT DOCUMENTS

| JP | 2004-103657 A | 4/2004 |
|---|---|---|
| KR | 1999-0057325 | 7/1999 |

OTHER PUBLICATIONS

Korean Office Action issued in Korean Patent Application No. KR 10-2006-0029002, dated May 28, 2007.

* cited by examiner

*Primary Examiner*—Thong Q. Le
(74) *Attorney, Agent, or Firm*—McDermott Will & Emery LLP

(57) ABSTRACT

A semiconductor storage device comprising: unit blocks each including memory cells, first row of sense amplifiers on one side of bit lines; second row of sense amplifiers on an other side of the bit lines; first switch means which switches a connection state between the one side of the bit lines and the first row of sense amplifiers; second switch means which switches a connection state between the other side of the bit lines and the second row of sense amplifiers; third switch means arranged in the approximate center of the bit lines in an extending direction thereof to switch a connection state of the bit lines; and refresh control means which divides the unit block into two areas and controls the refresh operation using the switch means and the row of sense amplifiers according to which area a selected word line to be refreshed is in.

11 Claims, 13 Drawing Sheets

FIG.10

| timing | operation | state of transistor switches ||||
| --- | --- | --- | --- | --- | --- |
| | | TS0 | TS1 | TS4 | TS5 |
| t0 | pre-charge | ON | ON | OFF | OFF |
| t1 | refresh : first half | OFF | ON | OFF | OFF |
| t2 | refresh : second half | ON | OFF | OFF | OFF |

SEMICONDUCTOR STORAGE DEVICE

BACKGROUND OF THE INVENTION

1. Field of the Invention

The present invention relates to a semiconductor storage device for performing refresh operation to hold date stored in a memory cell array. Particularly, the present invention relates to a semiconductor storage device for performing refresh operation in which connection state of bit lines is properly switched by switch means.

2. Description of the Related Art

As a general configuration of a semiconductor storage device such as DRAM, such a configuration in which a memory cell array is divided into a plurality of banks and each bank is further divided into a plurality of unit blocks has been well known. Data is stored and held in memory cells formed at intersections between a plurality of word lines and a plurality of bit lines in each unit block. In conventional DRAM, a row of sense amplifiers including a plurality of sense amplifiers is arranged on each of both sides of the unit block. A configuration in which switches are provided between the unit block and the row of sense amplifiers has been also proposed (see, for example, Japanese Patent Laid-Open No. 2004-103657).

Meanwhile, refresh operation needs to be performed at a predetermined time interval in order to hold data stored in DRAM. This refresh operation is so controlled that after bit lines of the unit block are pre-charged, a word line selected to be refreshed is activated, data of memory cells on the selected word line is read out through the bit lines, and the data is amplified by the row of sense amplifiers and is rewritten to the memory cells. Low power consumption of devices for mobile use such as DRAM is strongly required, and particularly reduction of current consumption in self refresh operation during stand-by is a problem. For its purpose, it is required to reduce current consumption of DRAM in self refresh operation and to prolong an interval of self refresh.

However, since a number of memory cells are formed on the bit lines included in each unit block, capacitance of the bit lines becomes larger, thereby increasing charge and discharge currents necessary in self refresh. Further, large sense margin of the sense amplifiers cannot be secured because of the capacitance of the bit lines increases, and a sufficiently long interval of self refresh cannot be obtained. Due to these factors, it is inevitable that current consumption in self refresh operation increases. On the other hand, in order to reduce current consumption in self refresh, the unit blocks may be formed in small size so as to reduce the capacitance of the bit lines. However, by employing a configuration in which the entire memory cell array is divided into a number of unit blocks, many rows of sense amplifiers need to be provided. Therefore, it is a problem that circuit scale increases thereby increasing chip area.

BRIEF SUMMARY OF THE INVENTION

An object of the present invention is to provide a semiconductor storage device capable of reducing refresh current, which prevents an increase of chip area overhead caused by an increase of circuit scale of the device, reduces charge and discharge currents of the bit lines in self refresh operation, and is capable of prolonging the interval of refresh.

An aspect of the present invention is a semiconductor storage device, comprising: one or more unit blocks each including a plurality of memory cells formed at intersections between a plurality of word lines and a plurality of bit lines, first row of sense amplifiers which is arranged on one side of said plurality of bit lines and includes a plurality of sense amplifiers for amplifying data of said plurality of memory cells through said plurality of bit lines in each said unit block; second row of sense amplifiers which is arranged on an other side of said plurality of bit lines and includes a plurality of sense amplifiers for amplifying data of said plurality of memory cells through said plurality of bit lines in each said unit block; first switch means which switches a connection state between said one side of said plurality of bit lines and said first row of sense amplifiers; second switch means which switches a connection state between said other side of said plurality of bit lines and said second row of sense amplifiers; third switch means which is arranged in an approximate center of said plurality of bit lines in an extending direction thereof and switches a connection state in which one side and an other side of said plurality of bit lines is either connected or disconnected; and refresh control means which sets a state in which said plurality of bit lines is disconnected by said third switch means in refresh operation so as to divide said unit block into a first area on said one side of said plurality of bit lines and a second area on said other side thereof, controls said refresh operation using said first switch means and said first row of sense amplifiers when a selected word line to be refreshed is in said first area, and controls said refresh operation using said second switch means and said second row of sense amplifiers when said selected word line to be refreshed is in said second area.

According to the aspect of the present invention, the first and second rows of sense amplifiers are arranged on both sides of the unit block and can be switched by the first and second switch means, and the unit block can be divided at the center by the third switch means. In refresh operation, a plurality of bit lines are controlled to be refreshed using the row of sense amplifiers in the area including the selected word line in a state in which the unit block is divided into the two areas. Thereby, since length of the bit lines connected to each sense amplifier in the refresh operation reduces by half compared to the entire length of those in the entire unit block, and corresponding thereto, capacitance of the bit lines can be reduced by half. Accordingly, charge and discharge currents of the bit lines are reduced and sense margin of the sense amplifiers is increased, so that the interval of the refresh can be prolonged. In this case, only the third switch means needs to be provided on a chip, while the rows of sense amplifiers having a large circuit scale need not to be increased. Therefore, the refresh current can be effectively reduced without increasing the chip area overhead.

In the present invention, said refresh control means may perform pre-charge operation for said plurality of bit lines and thereafter may perform two-cycle refresh operation in which said plurality of bit lines is divided into half for each cycle using said first or second row of sense amplifiers.

In the present invention, said memory cell array may be configured using a shared sense amplifier system in which adjacent said unit blocks between which said first or second row of sense amplifiers is arranged share said first or second row of sense amplifiers.

In the present invention, each of said first, second and third switches may be a transistor switch controlled on/off by a selection control line connected to a gate thereof.

In the present invention, each said sense amplifier included in said first and second rows of sense amplifiers may have two input terminals for connecting a bit line pair composed of two bit lines, and said memory cell may be formed at one of two intersections of said bit line pair on an arbitrary word line of said unit block.

In the present invention, said memory cell array may have a ¼ pitch cell array configuration, and of four adjacent bit lines, said first and second switch means may switch a connection state of odd number bit lines and a connection state of even number bit lines respectively to said two input terminals of each said sense amplifier.

In the present invention, said memory cell array may have a ½ pitch cell array configuration, and of four adjacent bit lines, said first and second switch means may switch a connection state of a bit line pair composed of adjacent two bit lines on one side and a connection state of a bit line pair composed of adjacent two bit lines on an other side respectively to said two input terminals of each said sense amplifier.

In the present invention, said refresh control means may control so that said selected word line in said first area and said selected word line in said second area are both set to be refreshed, and a refresh operation using said first switch means and said first row of sense amplifiers and a refresh operation using said second switch means and said second row of sense amplifiers are performed at the same timing.

In the present invention, each of said first and second areas may include half of said plurality of word lines in said unit block.

In the present invention, said refresh control means may control self refresh operation at a predetermined interval to hold data during stand-by.

As described above, according to the present invention, a semiconductor storage device has a configuration in which the rows of sense amplifiers are arranged on both sides of the unit block so as to disconnect the unit block at the center, and control is performed in the refresh operation so that the bit lines are refreshed using the row of sense amplifiers on the side including the selected word line. By such a configuration, length of the bit lines connected each sense amplifier reduces by half. Thus, it is possible to reduce charge and discharge currents by reducing capacitance of the bit lines by half, and to prolong an interval of the refresh by increasing sense margin of the sense amplifiers. By a combination of these effects, the refresh current can be largely reduced without increasing the chip area due to circuit scale increase caused by rows of sense amplifiers and the like.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 10 is a view showing states of switching control in the refresh operation in this embodiment.

DETAILED DESCRIPTION OF THE INVENTION

The preferred embodiment of the present invention will be described with reference to the accompanying drawings. Hereinafter, an example in which the present invention is applied to DRAM as a semiconductor storage device will be described. First, the configuration of major portions in the DRAM of this embodiment will be described with reference to FIGS. 1 to 4.

Figure 1:
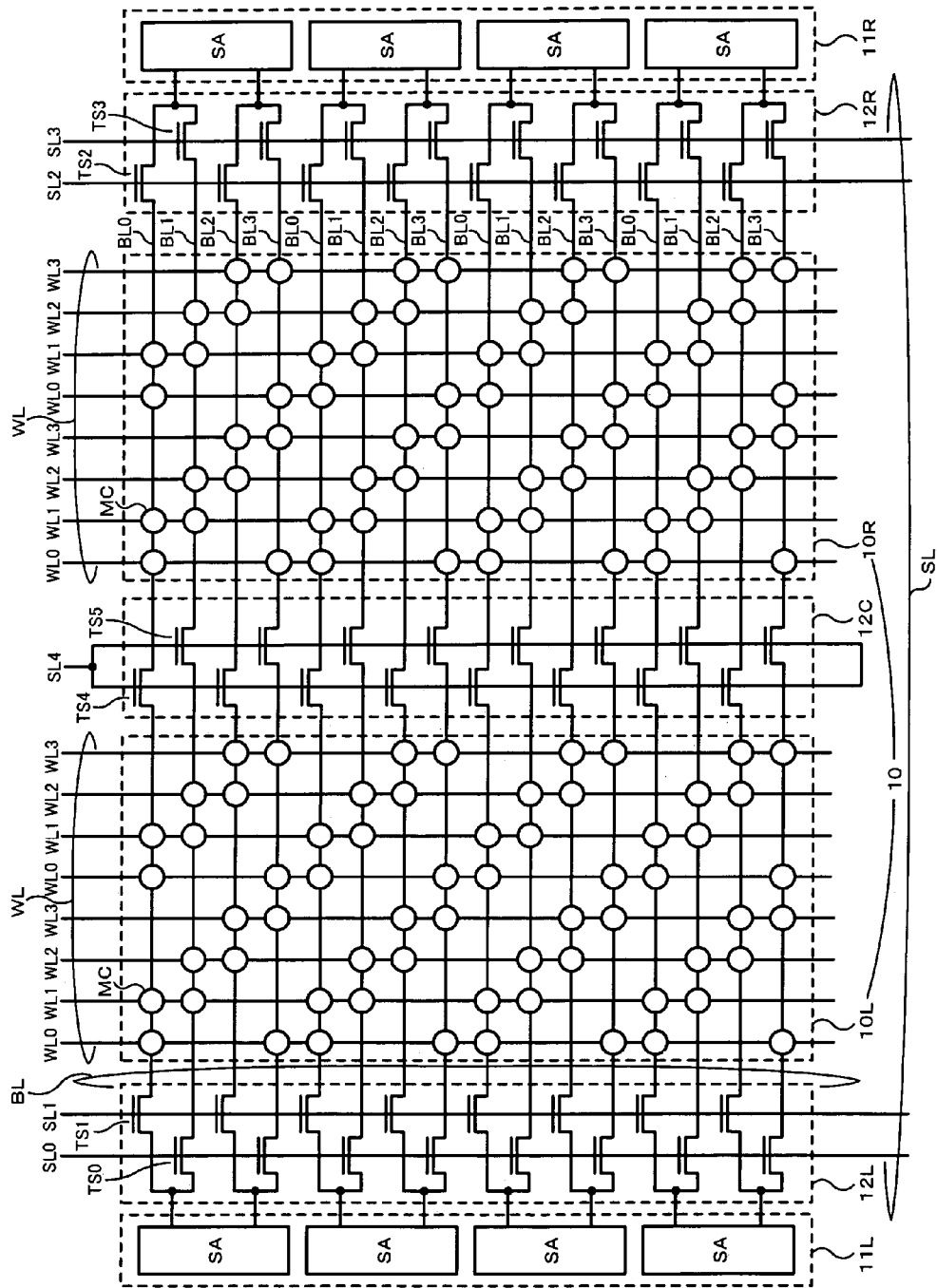
FIG. 1 is a view showing a configuration of a mat employing a ¼ pitch cell array configuration in which adjacent mats do not share sense amplifiers in DRAM of this embodiment.
Figure 2:
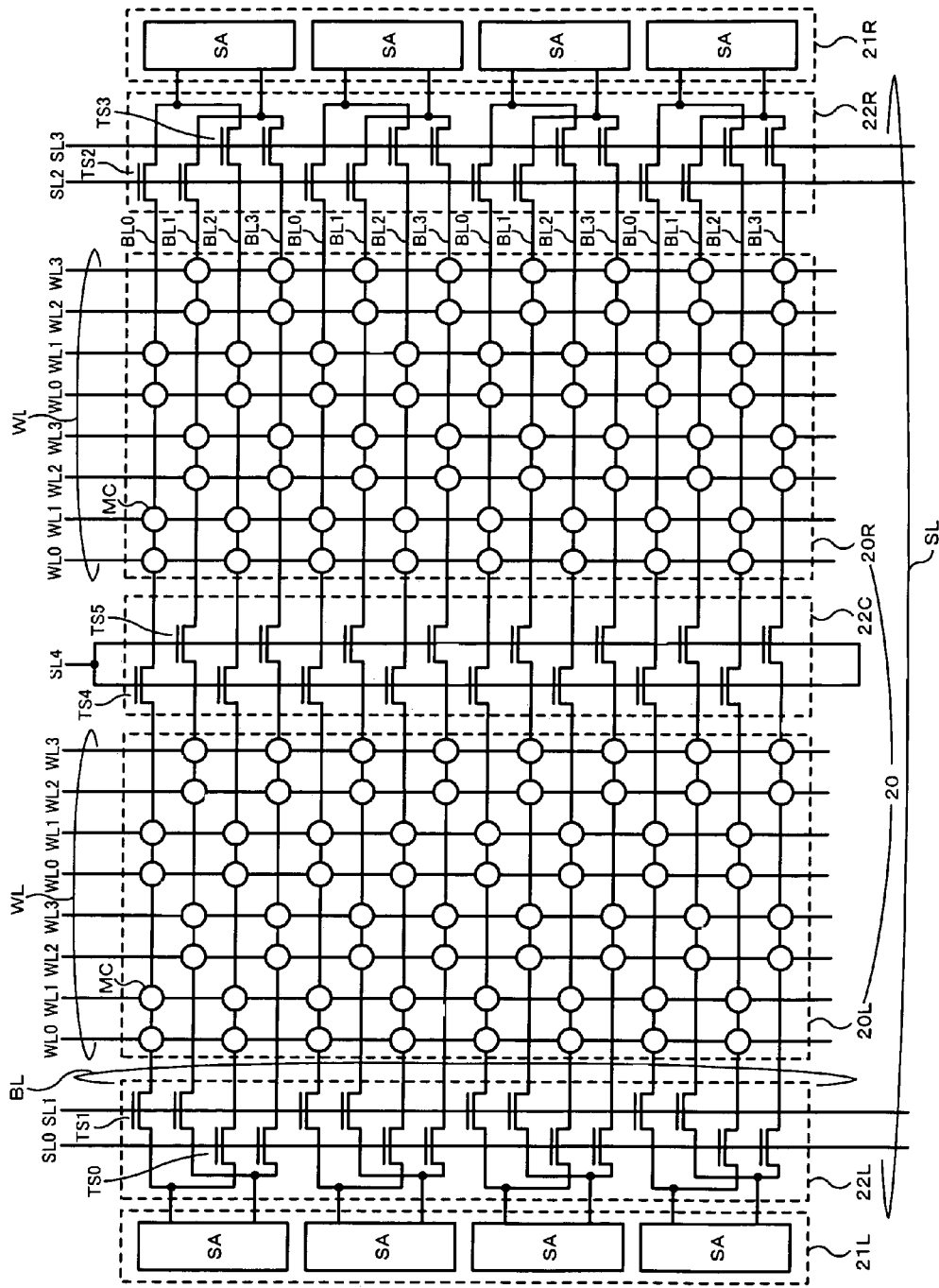
FIG. 2 is a view showing a configuration of a mat employing a ½ pitch cell array configuration in which adjacent mats do not share sense amplifiers in DRAM of this embodiment.
Figure 3:
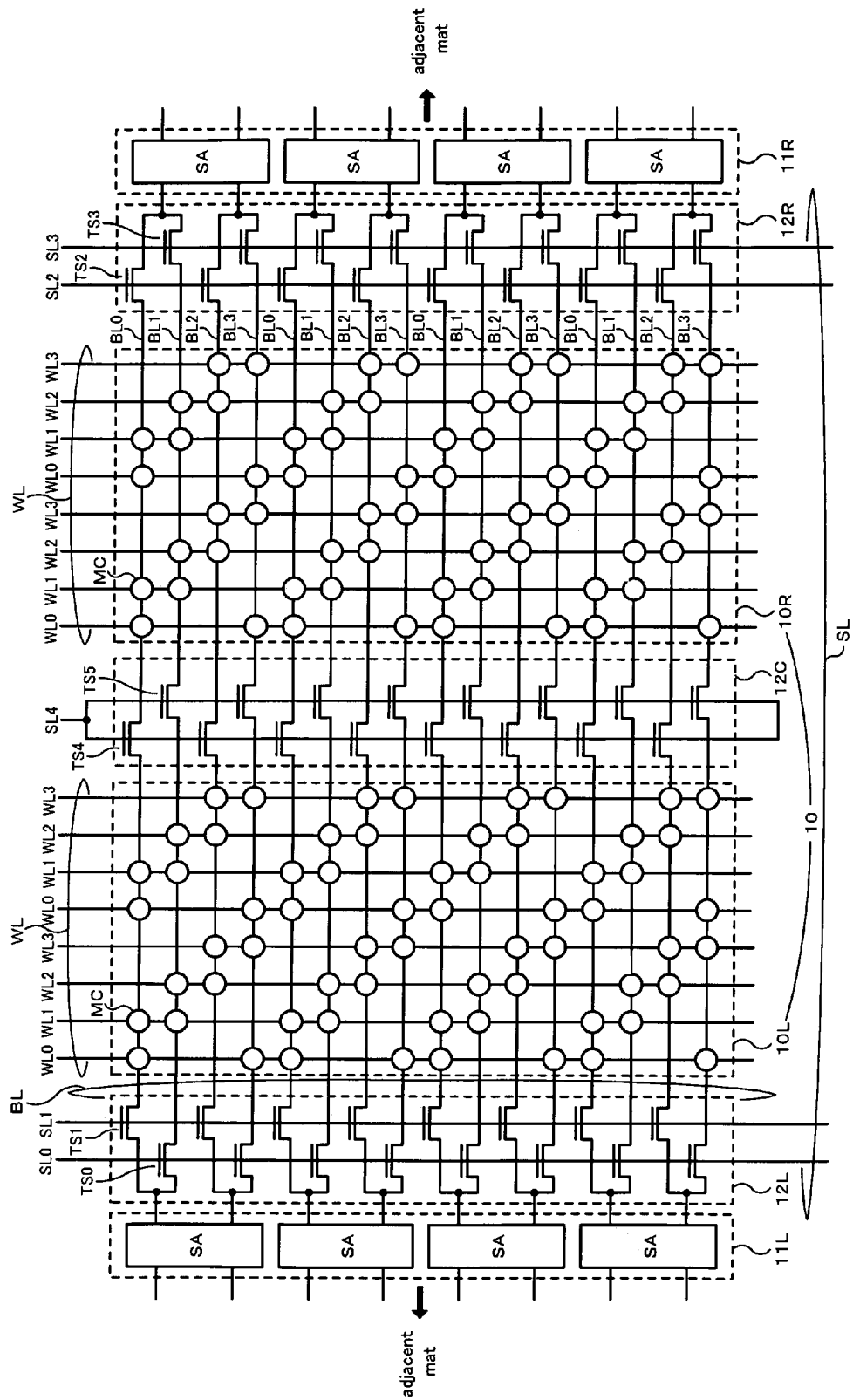
FIG. 3 is a view showing a configuration of a mat employing a shared sense amplifier system and a ¼ pitch cell array configuration in DRAM of this embodiment.
Figure 4:
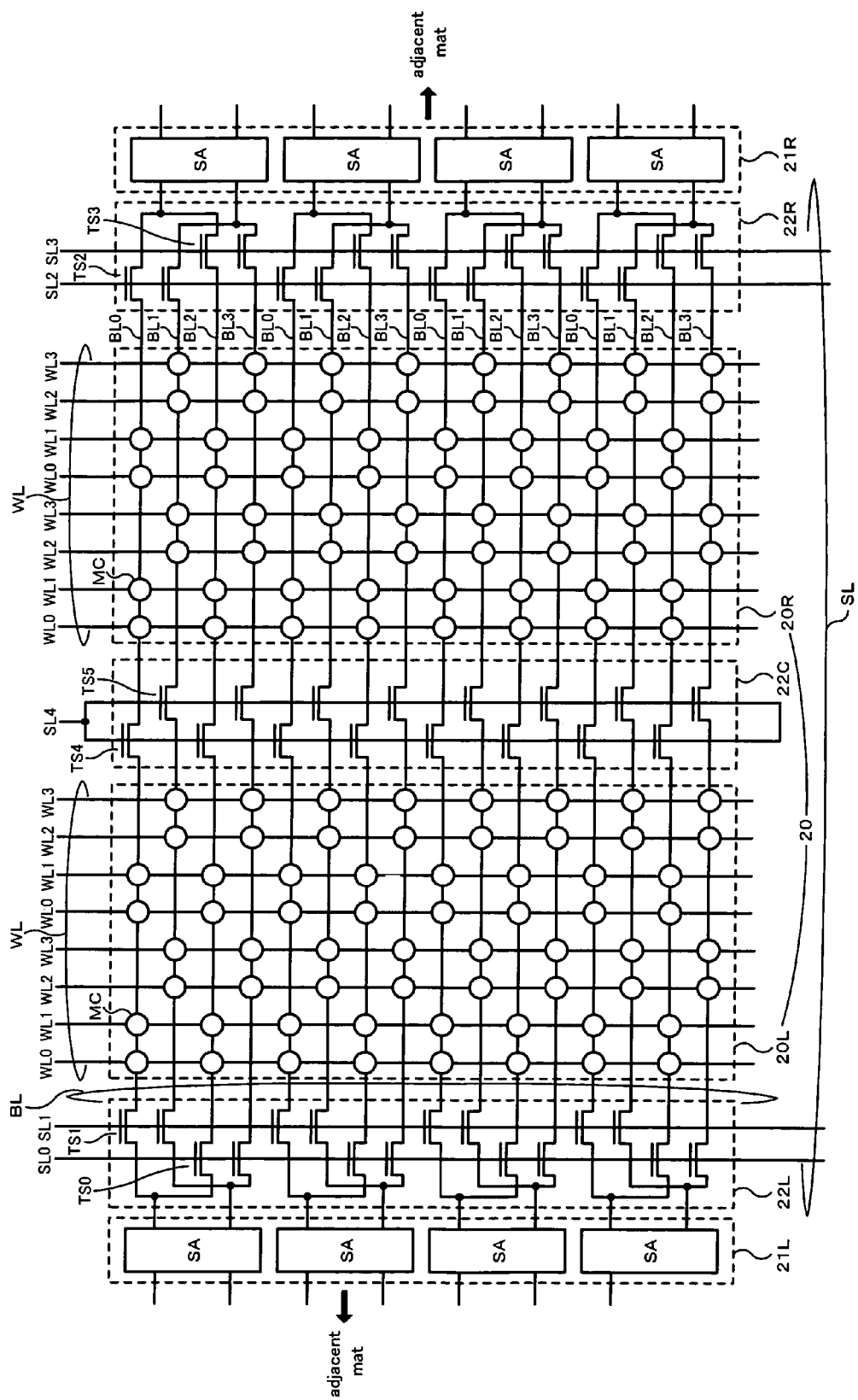
FIG. 4 is a view showing a configuration of a mat employing a shared sense amplifier system and a ½ pitch cell array configuration in DRAM of this embodiment.

FIGS. 1 to 4 show four different configurations of a mat 10 as a unit block which is obtained by dividing a memory cell array of the DRAM of this embodiment and its peripheral portion. FIGS. 1 and 2 show a configuration in which adjacent mats 10 do not share the sense amplifiers, and FIGS. 3 and 4 show a configuration employing a shared sense amplifier system in which the adjacent mats 10 share the sense amplifier. FIGS. 1 and 3 show a configuration called ¼ pitch cell array configuration and FIGS. 2 and 4 show a configuration called ½ pitch cell array configuration. These ¼ pitch cell array configuration and the ½ pitch cell array configuration will be described later in detail.

First, the configuration of FIG. 1 will be described. Meanwhile, since the mat 10 and its peripheral portion are basically common to the configurations of FIGS. 1 and 3, following description will be applied to the configuration of FIG. 3. The mats 10 are formed within a range including a plurality of the word lines WL and a plurality of bit lines BL intersecting therewith. Although FIGS. 1 to 4 show an example in which a single mat 10 includes sixteen word lines WL and sixteen bit lines BL, generally, a mat 10 of a desired size can be formed by arranging m word lines WL and n bit lines BL.

The mat 10 shown in FIG. 1 is divided into two areas 10L and 10R between which later-described switch controller 12C is located. In other words, there exist one area 10L including eight word lines WL (left side of FIG. 1) and the other area 10R including eight word lines WL (right side in FIG. 1). Role and operation of these two areas 10L and 10R and the switch controller 12C will be described later.

Memory cells MC are formed at intersections corresponding to half of all intersections between the word lines WL and the bit lines BL within the mat 10. That is, if m×n intersections are formed by m word lines WL and n bit lines BL, m×n/2 memory cells are formed so that the entire mat 10 can store data of m×n/2 bits. Each memory cell MC includes a MOS transistor and a capacitor and stores data of 1 bit depending on accumulated charge. Intersections at each of which a memory cell is formed and intersections at each of which no memory cell is formed are arranged regularly according to a predetermined pattern in the mat 10.

The memory cells MC on the word line WL and the bit line BL are disposed in the same pattern at every fourth line of the both lines. As shown in FIG. 1, word lines WL0, WL1, WL2 and WL3 corresponding to four kinds of patterns and bit lines BL0, BL1, BL2 and BL3 corresponding to four kinds of patterns are expressed separately. For example, in the bit line BL0 located at the uppermost of the four bit lines BL in FIG. 1, a pattern in which two intersections with memory cells MC and two intersections without memory cells are repeated. In the bit line BL1 located at the second position, the pattern of the bit line BL0 is shifted by one to the right and in respective bit lines BL2 and BL3 located at the third and fourth positions, the pattern is shifted by one each to the right successively. The word lines WL has the same configuration so that the pattern is shifted by one in the order of the word lines WL0 to WL3.

The configuration of FIG. 1 is called a ¼ pitch cell array configuration because the four word lines WL are arranged in a repetitive unit (1 pitch) while adjacent bit lines BL are shifted by only ¼ of the aforementioned pitch. As shown in FIG. 1, in two areas 10L and 10R, each arrangement of the memory cells MC in the mat 10 is the same pattern as each other.

On the other hand, two rows of sense amplifiers 11L and 11R each including a predetermined number of the sense amplifiers SA, five selection control lines SL0 to SL4 and switch controllers 12L, 12R and 12C each including a plurality of transistor switches controlled ON/OFF by the selection control lines SL0 to SL4 are provided around the mat 10. In the area 10L of the mat 10 (left side of FIG. 1), a row of sense amplifiers 11L, the selection control lines SL0 and SL1 and the switch controller 12L including a predetermined number of the transistor switches TS0 and TS1 are arranged. And the area 10R (right side in FIG. 1) of the mat 10, a row of sense amplifiers 11R, the selection control lines SL2 and SL3 and the switch controller 12R including a predetermined number of the transistor switches TS2 and TS3 are arranged. Further, in the center of the mat 10, the selection line SL4, the switch controller 12C including a predetermined number of the transistor switches TS4 and TS5 are arranged. Left and right sides of the mat 10 and its peripheral portion of FIG. 1 are configured symmetrically to each other.

In the left side of FIG. 1, the switch controller 12L (first switch means) is arranged between each sense amplifier SA in the row of sense amplifiers 11L (first row of sense amplifiers) and one side of the bit lines BL in the area 10L (first area). And, the switch controller 12R (second switch means) is arranged between each sense amplifier SA in the row of sense amplifiers 11R (second row of sense amplifiers) and the other side of the bit lines BL in the area 10R (second area). In the case of FIG. 1, the transistor switch TS0 or TS1 is connected to the left side row of sense amplifiers 11L and the transistor switch TS2 or TS3 is connected to the right side row of sense amplifiers 11R.

The switch controller 12C (third switch means) is arranged between bit lines BL corresponding to each other on both areas 10L and 10R. Thereby, of the four bit lines BL as a set, odd number bit lines BL0 and BL2 are connected between both transistor switches TS1 and TS2 through the transistor switch TS4, and even number bit lines BL1 and BL3 are connected between both transistor switches TS0 and TS3 through the transistor switch TS5.

Each sense amplifiers SA in the rows of sense amplifiers 11L and 11R has two input terminals. Both the two input terminals of each sense amplifiers SA in the left side row of sense amplifiers 11L are connected to both transistor switches TS0 and TS1, and both the two input terminals of each sense amplifiers SA in the right side row of sense amplifiers 11R are connected to both transistor switches TS2 and TS3. Thus, all the sense amplifiers SA included in the rows of sense amplifiers 11L and 11R can be connected to the four bit lines BL as a set selectively.

Different control signals are applied to the selection control lines SL0 to SL4. The selection control lines SL0 to SL3 are connected in the order thereof to each gate of the transistor switches TS0 to TS3 in the switch controllers 12L and 12R on the both sides and are controlled ON/OFF in response to respective control signals. The selection control line SL4 is connected to each gate of the transistor switches TS4 to TS5 in the switch controller 12C in the center and controlled ON/OFF simultaneously in response to a common control signal. Each of transistor switches TS0 to TS5 is controlled to be turned ON when the control signal applied through the selection control lines SL0 to SL4 is high and to be turned OFF when the control signal is low.

Next, the configuration of FIG. 2 will be described. FIG. 2 shows a mat 20 formed within a range including a plurality of the word lines WL and a plurality of the bit lines BL like FIG. 1. Although this configuration is the same as FIG. 1 in that the memory cells MC are formed at intersections corresponding to half of all intersections between the word lines WL and the bit lines BL, the arrangement of the memory cells MC is different. That is, the configuration of FIG. 2 is called a ½ pitch cell array configuration because the four word lines WL are arranged in a repetitive unit (1 pitch) while adjacent bit lines BL are shifted by only half of the aforementioned pitch (corresponding to two memory cells MC).

The mat 20, which is the same in FIG. 1, is divided into two areas 20L and 20R each including eight word lines WL. Two rows of sense amplifiers 21L and 21R each including a predetermined number of the sense amplifiers SA, five selection control lines SL0 to SL4 and switch controllers 22L, 22R and 22C each including a plurality of transistor switches controlled ON/OFF by the selection control lines SL0 to SL4 are provided around the mat 20. Although respective components of FIG. 2 are common to FIG. 1 in this case, its connection form is different from FIG. 1, reflecting a difference of the arrangement of the memory cells MC of the mat 20.

More specifically, of four bit lines BL as a set, adjacent bit lines BL0 and BL1 are connected between the transistor switches TS1 and TS2 through the transistor switches TS4 and TS5, and adjacent bit lines BL2 and BL3 are connected between the transistor switches TS0 and TS3 through the transistor switches TS4 and TS5. Two input terminals of each sense amplifier SA in the left side row of sense amplifiers 21L are connected to both transistor switches TS0 and TS1, and two input terminals of each sense amplifier SA in the right side row of sense amplifiers 21R are connected to both transistor switches TS2 and TS3.

Comparing the configuration of FIG. 2 with the configuration of FIG. 1, a combination of the bit lines BL connected to the two input terminals of the sense amplifier SA is different. In the configuration of FIG. 2, either of a bit line pair composed of bit lines BL0 and BL2 or a bit line pair composed of bit lines BL1 and BL3 is connected to the two input terminals of the sense amplifier SA. In a case in which a bit line pair is composed in such a combination, each memory cell MC is connected to only one input terminal of the sense amplifier SA when an arbitrary word line WL is selected, like the case in FIG. 1.

Next, the configurations adopting the shared sense amplifier system of FIGS. 3 and 4 will be described. Basically, respective components of FIG. 3 are common to FIG. 1 and respective components of FIG. 4 are common to FIG. 2. A difference of this case exists in that each of two rows of sense amplifiers 11L and 11R is shared by adjacent two mats 10. For example, the left side row of sense amplifiers 11L of FIG. 3 has two input terminals on the left as well as two input terminals on the right and the input terminals on the left are connected to other mat 10 (not shown) on the left through the switch controller 12R located on the right thereof. The same pattern is repeatedly arranged on both sides of the configuration shown in FIG. 3. This is the same for FIG. 4. This configuration allows the adjacent two mats 10 (20) to separately use the row of sense amplifiers 11L or 11R (21L or 21R) therebetween by controlling the switch controllers 12L and 12R (22L and 22R) on both sides of the row of sense amplifiers 11L or 11R (21L or 21R) appropriately.

Figure 5:
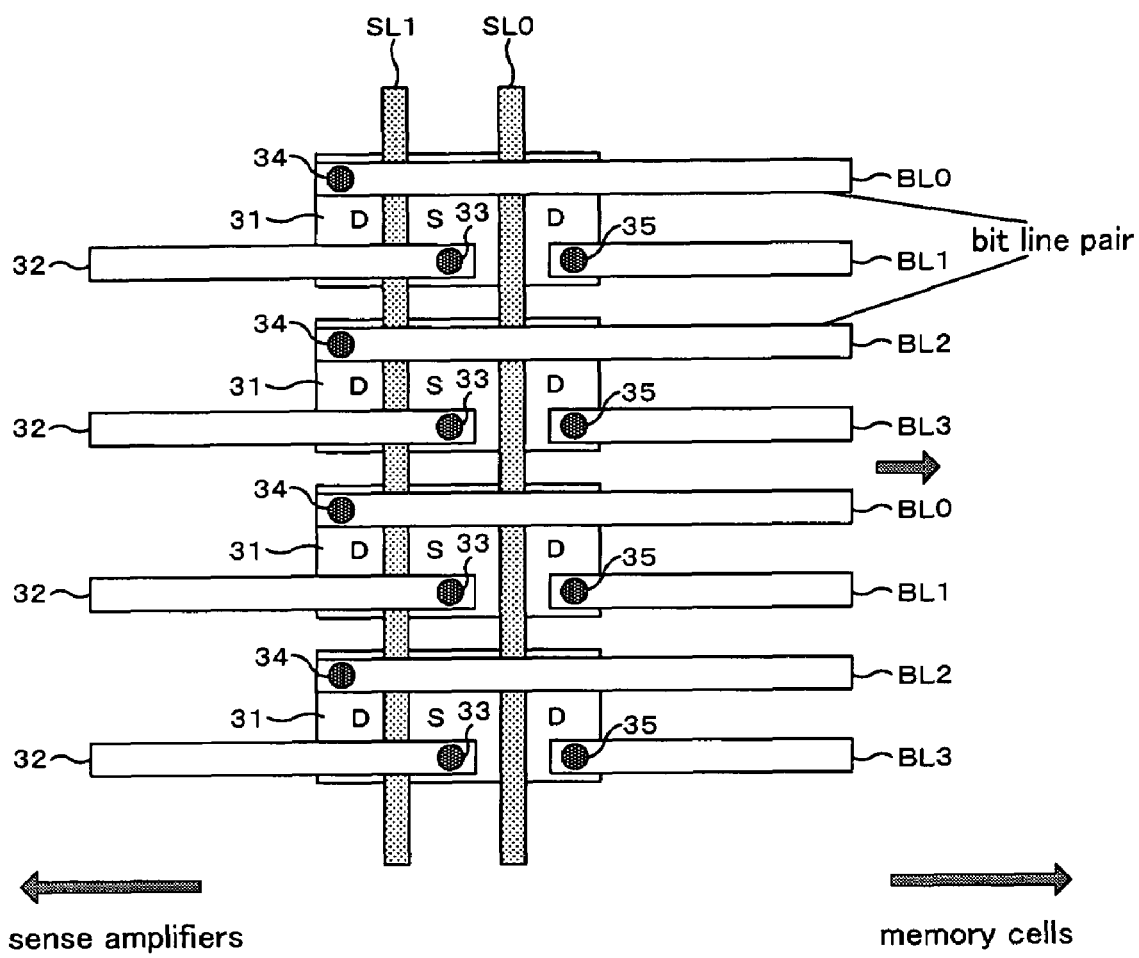
FIG. 5 is a view showing an example of a first layout of the switch controller corresponding to the ¼ pitch cell array configuration of FIG. 1 or 3.

Next, examples of layouts of the switch controllers 12L, 12R and 12C in a case where this embodiment is constructed on a semiconductor chip will be described. FIG. 5 shows an example of a first layout of the switch controller 12L corresponding to the ¼ pitch cell array configuration shown in FIG. 1 or 3. The layout of FIG. 5 includes transistor switches TS0 and TS1 connected to the two sense amplifiers SA in the left side row of sense amplifiers 11L of FIG. 1 of the switch controller 12L and its peripheral portion. A pair of the transistor switches TS0 and TS1 is composed of combined MOS transistors. Four rectangular diffusion layers 31 formed corresponding to the MOS transistors are disposed in a range shown in FIG. 5, so that four pairs of the transistor switches TS0 and TS1 can be formed.

Two selection control lines SL0 and SL1 arranged in parallel to each other serve as gate electrodes in each diffusion layer 31, and a source S between the selection control lines SL0 and SL1 and two drains D on both sides thereof are formed. Wire 32 connected to one input terminal of the sense amplifier SA is connected to the source S of the diffusion layer 31 through a contact 33. Each of the odd number bit lines BL0 and BL2 is connected to one drain of the diffusion layer 31 through a contact 34. Further, each of the even number bit lines BL1 and BL3 are connected to the other drain D of the diffusion layer 31 through a contact 35. As described above, the two bit lines BL arranged on every other line form a bit line pair connected to one sense amplifier SA.

In the layout of FIG. 5, each diffusion layer 31 needs to have a size which allows an arrangement with a gap corresponding to two bit lines BL. Thus, the entire layout area can be reduced, but the width of a channel of each MOS transistor which depends upon the size of the diffusion layer 31 is limited.

Figure 6:
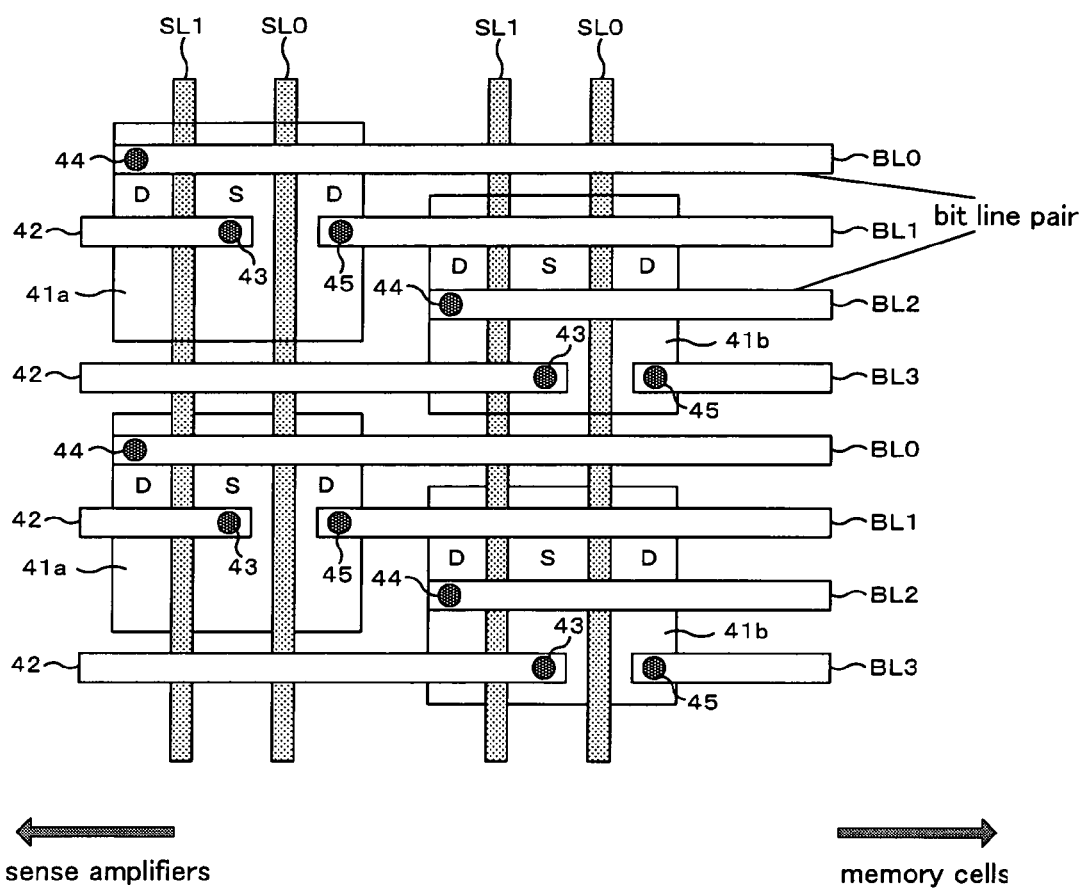
FIG. 6 is a view showing an example of a second layout of the switch controller corresponding to the ¼ pitch cell array configuration of FIG. 1 or 3.

Meanwhile, FIG. 6 shows an example of a second layout of the switch controller 12L corresponding to the ¼ pitch cell array configuration shown in FIG. 1 or 3. The layout of FIG. 6 includes four diffusion layers 41 (41a and 41b) and the MOS transistors which form four pairs of transistor switches TS0 and TS1 in the switch controller 12L as similar components to FIG. 5. However a difference exists in the shape and arrangement of the diffusion layer 41 as compared with FIG. 5. That is, the respective diffusion layers 41 are not disposed in line but two diffusion layers 41a and two diffusion layers 41b are formed at each shifted position, so that they are disposed in two lines.

Since the selection control lines SL0 and SL1 are used as a gate electrode of one diffusion layer 41a and a gate electrode of the other diffusion layer 41b, they are arranged by two each totaling four lines in parallel. A source S between the selection control lines SL0 and SL1 and two drains D on both sides thereof are formed in the respective diffusion layers 41a and 41b. Each wire 42 connected to one input terminal of the sense amplifier SA is connected to the source S of the diffusion layer 41a or 41b through a contact 43. Each of the odd number bit lines BL0 and BL2 are connected to one drain D of each of the diffusion layers 41a and 41b through a contact 44. Further, each of the even number bit lines BL1 and BL3 are connected to the other drain D of the diffusion layers 41a and 41b through a contact 45. The bit line pairs shown in FIG. 6 are formed in the same combination as FIG. 5.

However, in the layout shown in FIG. 6, diffusion layers 41a and 41b can have a size which allows an arrangement with a gap corresponding to four bit lines BL, different from the layout of FIG. 5. The size necessary in the extension direction of the bit line BL is increased because of the diffusion layers 41a and 41b disposed in two lines. Thus, the channel width of the MOS transistors can be increased sufficiently although the entire layout area is increased. Consequently, a sufficient current can be supplied to the MOS transistors of the switch controller 12L, whereby providing an advantageous configuration from viewpoints of operating velocity.

Figure 7:
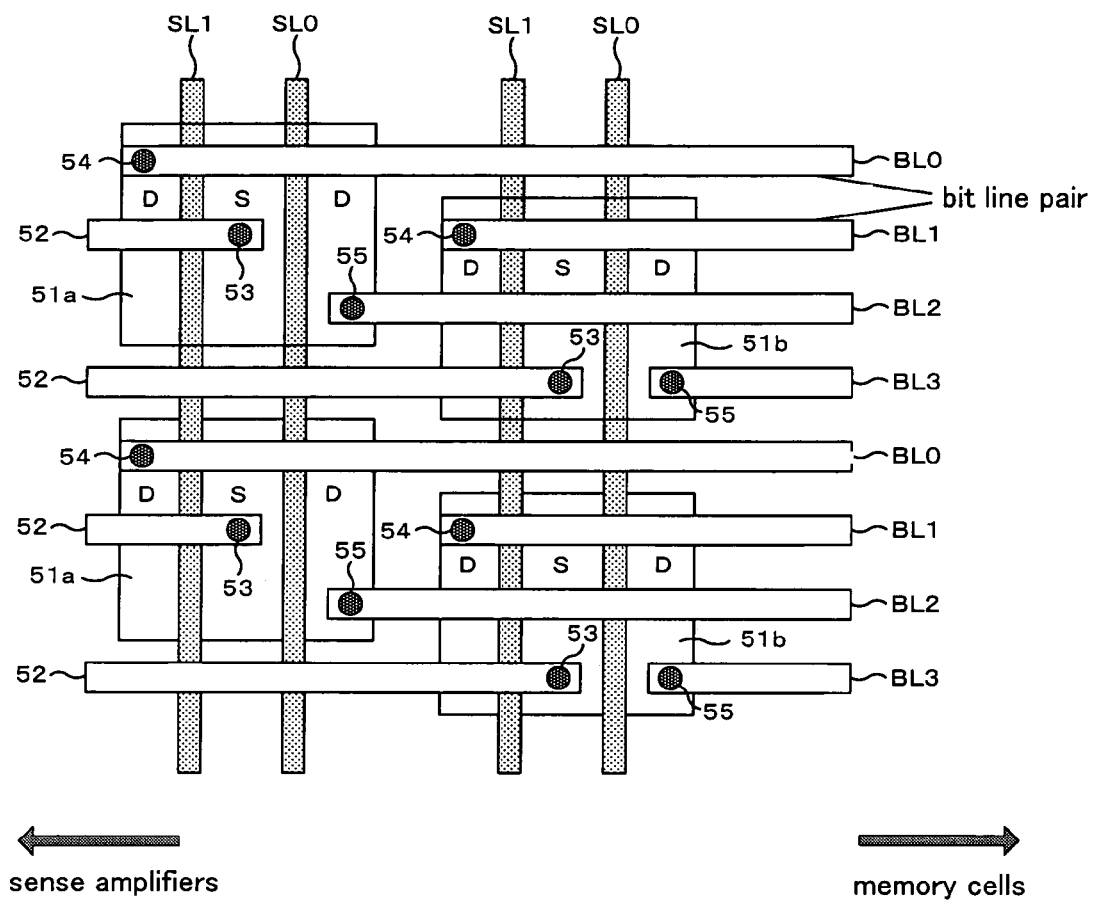
FIG. 7 is a view showing an example of a layout of the switch controller corresponding to the ½ pitch cell array configuration of FIG. 2 or 4.

FIG. 7 shows an example of a layout of the switch controller 22L corresponding to the ½ pitch cell array configuration shown in FIG. 2 or 4. The layout of FIG. 7 includes transistor switches TS0 and TS1 connected to two sense amplifiers SA in the left side row of sense amplifiers 21 of FIG. 2 in the switch controller 22 and its peripheral portion. In this case, the shape and arrangement of the diffusion layers 51a and 51b corresponding to the MOS transistors and the configuration of the selection control lines SL0 and SL1 are common to the layout of FIG. 6.

In each of the diffusion layers 51a and 51b, the selection control lines SL0 and SL1 are used as gate electrodes and the source S between the selection control lines SL0 and SL1 and two drains D on both sides thereof are formed. Each wire 52 connected to one input terminal of the sense amplifier SA is connected to the source S of the diffusion layer 51a or 51b through a contact 53. The bit lines BL are connected to two drains D on both sides of the diffusion layers 51a and 51b through contacts 54 and 55 and the two bit lines BL are arranged on every other line. The layout of FIG. 7 reflects the configuration of FIG. 2, thereby achieving a layout for forming a bit line pair with adjacent two bit lines BL.

In addition, in the layout of FIG. 7, the entire layout area is increased but it is the same as the layout of FIG. 6 in that the channel width of the MOS transistors can be increased.

Figure 8:
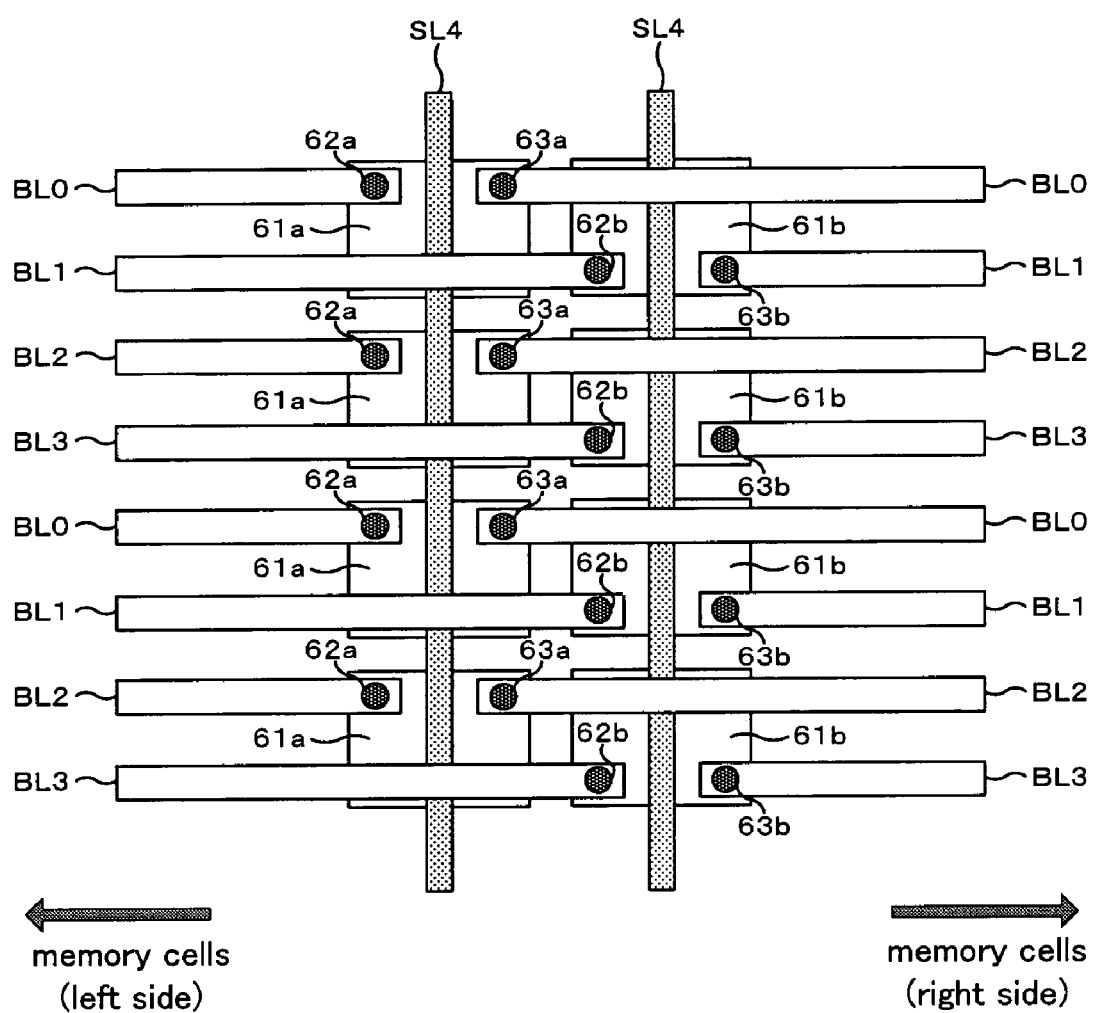
FIG. 8 is a view showing an example of a layout of the switch controller in the center in the configuration shown in FIGS. 1 to 4.

FIG. 8 shows an example of a layout of the switch controller 12C (22C) in the configuration shown in FIGS. 1 to 4. Regarding the switch controller 12C (22C), the layout is common to the ½ pitch cell array configuration and the ¼ pitch cell array configuration. The layout of FIG. 8 includes two transistor switches TS4 and TS5 in the switch controller 12C and its peripheral portion. The transistor switches TS4 and TS5 are composed of independent MOS transistors respectively. Rectangular diffusion layers 61a each corresponding to a MOS transistor of the transistor switch TS4 and rectangular diffusion layers 61b each corresponding to a MOS transistor of the transistor switch TS5 are disposed side by side and totaling eight diffusion layers 61a and 61b are disposed in a range shown in FIG. 8.

As shown in FIG. 8, two selection control lines SL4 are arranged in parallel so that one thereof is used as gate electrodes of the diffusion layers 61a and the other thereof is used as gate electrodes of the diffusion layers 61b. In each diffusion layer 61a, contacts 62a and 63a are formed on source/drain regions of both sides of the selection control line SL4. Odd number bit lines BL0 and BL2 extending to the left side switch controller 12L are connected through the contacts 62a, and even number bit lines BL1 and BL3 extending to the right side switch controller 12R are connected through the contacts 63a. Further, in each diffusion layer 61b, contacts 62b and 63b are formed on source/drain regions of both sides of the selection control line SL4. Even number bit lines BL1 and BL3 extending to the left side switch controller 12L are connected through the contacts 62b, and even number bit lines BL1 and BL3 extending to the right side switch controller 12R are connected through the contacts 63b.

In the layout of FIG. 8, since each of diffusion layers 61a and 61b are formed so that they are disposed with a gap of two bit lines BL, a restriction of the channel width of the MOS transistors is the same as in the layout of FIG. 5.

Figure 9:
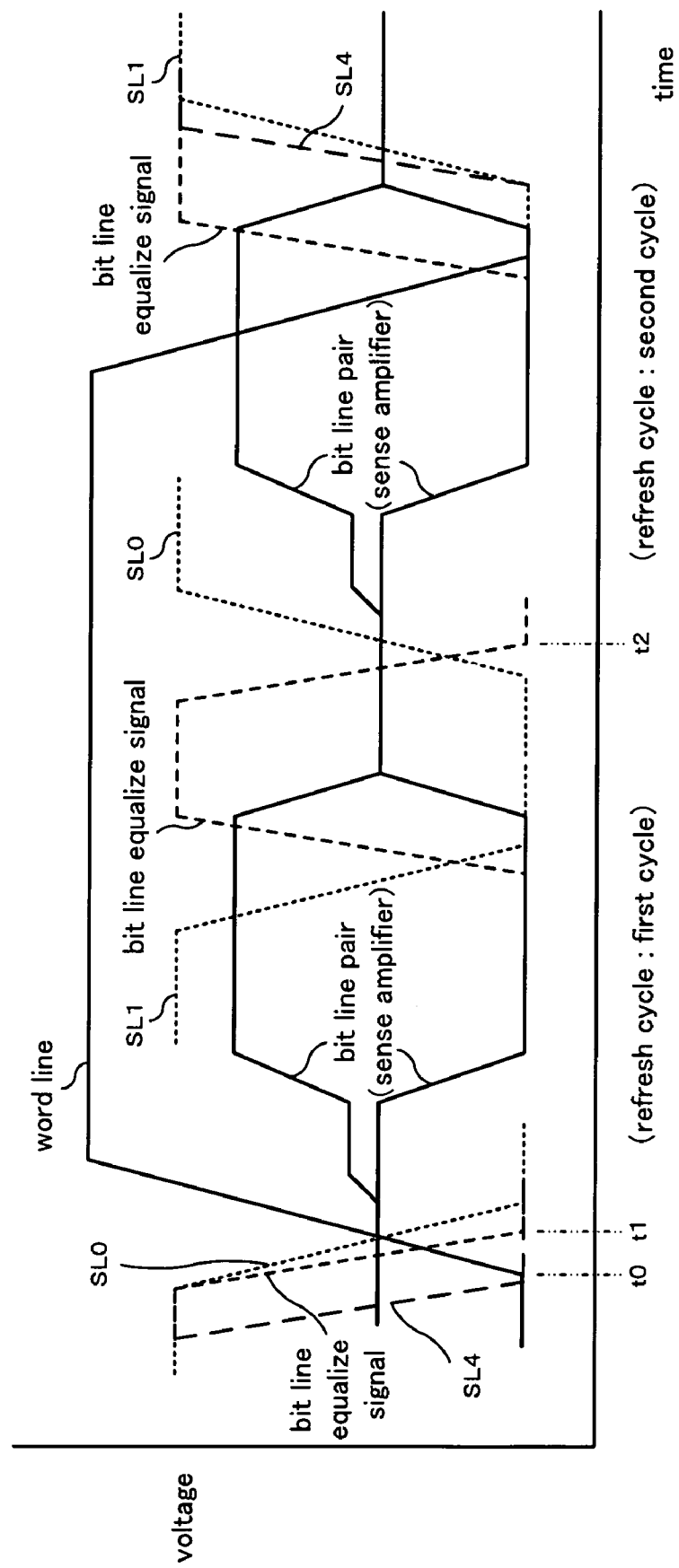
FIG. 9 is a view showing signal waveforms in this embodiment.
Figure 11:
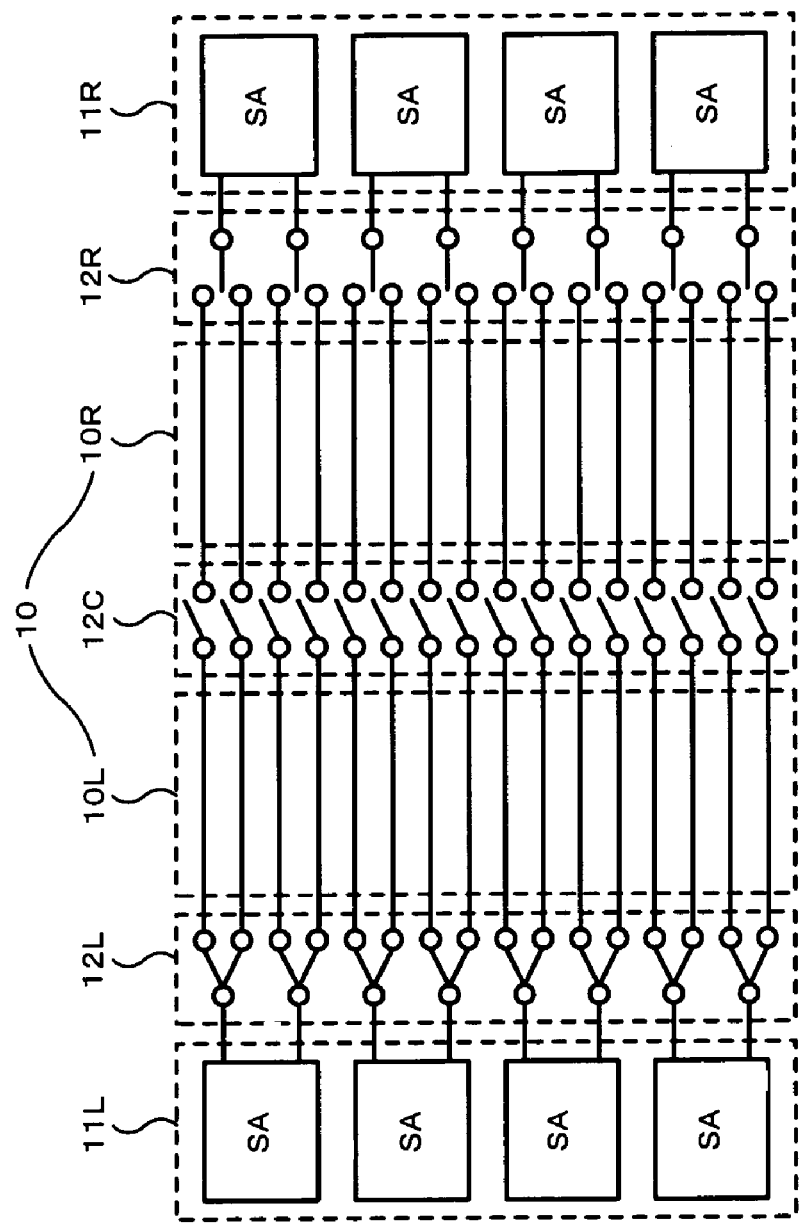
FIG. 11 is a connection state diagram in which the pre-charge operation prior to the refresh operation is performed in this embodiment.
Figure 12:
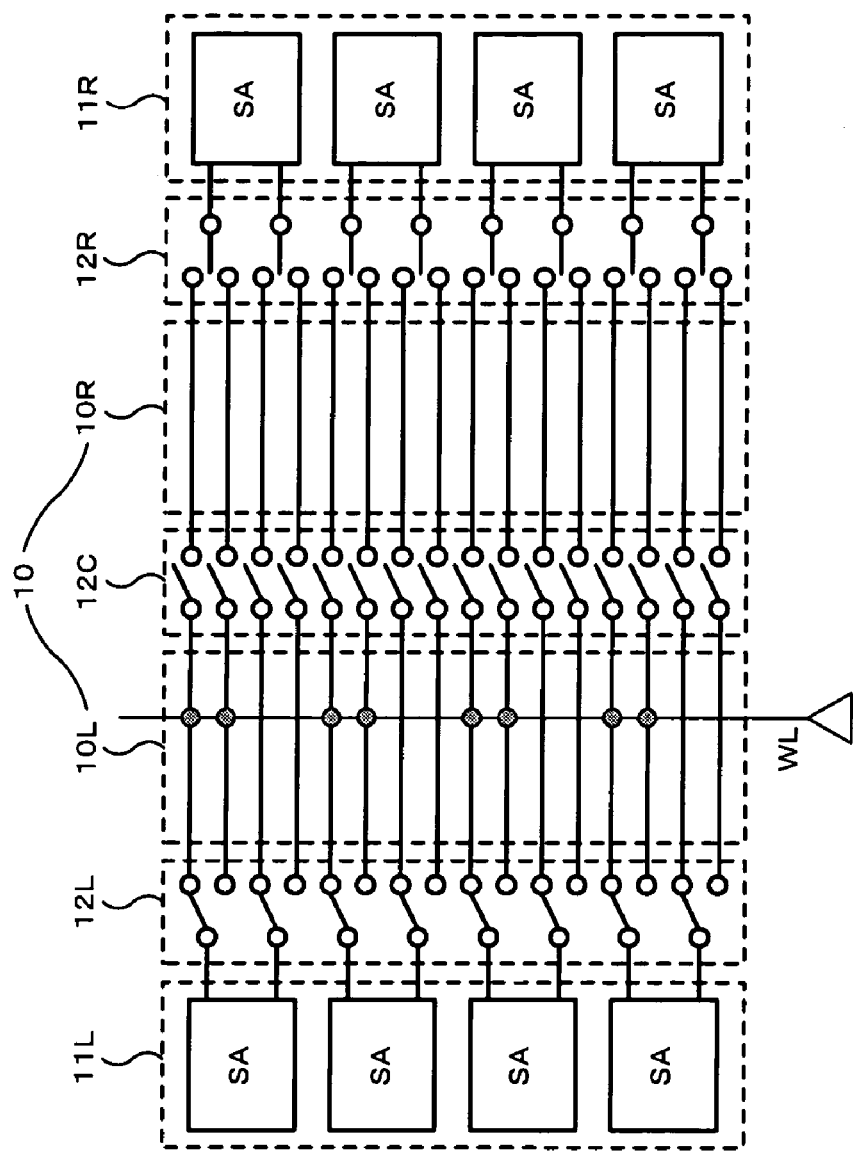
FIG. 12 is a connection state diagram of refresh cycle of first half of the refresh operation in this embodiment.
Figure 13:
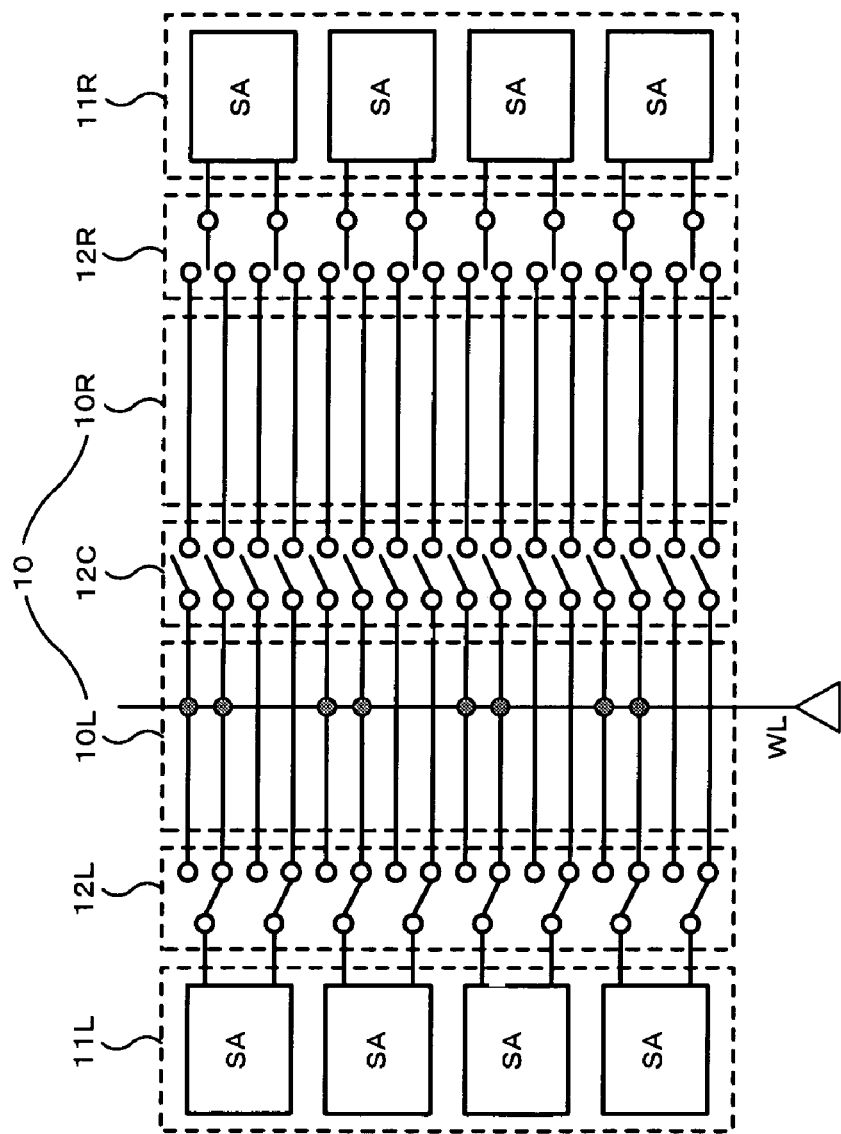
FIG. 13 is a connection state diagram of refresh cycle of second half of the refresh operation in this embodiment.

Next, the refresh operation of the DRAM of this embodiment will be described. Hereinafter, a control flow when performing refresh operation for holding data at a predetermined interval will be described on the assumption that the ¼ pitch cell array configuration is employed in DRAM of FIG. 3. FIG. 9 shows signal waveforms of DRAM at the time of the refresh operation, FIG. 10 shows states of switching control in the refresh operation, and FIGS. 11 to 13 show connection states corresponding to switching control in the refresh operation.

Normal operation of the DRAM of this embodiment is the same as that of DRAM having a general configuration. That is, two transistor switches TS4 and TS5 in the switch controller 12C in the center are controlled ON so that bit lines BL in the two areas 10L and 10R of the mat 10 are connected to each other. At the same time, of transistor switches TS0 to TS3 in the left and right switch controllers 12L and 12R, for example, transistor switches TS1 and TS3 are controlled OFF. Thereby, read or write operation of an arbitrary memory cell MC in the mat 10 can be performed by the same control as that in the conventional configuration without the switch controller 12C and the transistor switches TS1 and TS3.

In contrast, the refresh operation of this embodiment is performed according to a control different from that of the conventional configuration. In this embodiment, in a state in which the mat 10 is divided into two areas 10L and 10R, the refresh operation is performed for each area 10L or 10R separately. In the following description, the refresh operation for the area 10L on the left side of the mat 10 in the configuration of FIG. 1 is exemplified. Hereinafter, the transition of the refresh operation with the lapse of time will be described based on the waveforms diagram of FIG. 9.

First, a refresh command is issued and a predetermined word line WL included in the area 10L of the mat 10 is selected to be refreshed based on a row address. It can be discriminated whether the selected word line to be refreshed is included in the area 10L or 10R by referring to one bit of the row address. Then, at the initial time of FIG. 9, pre-charge operation prior to the refresh operation is performed. At this time, when the selection control line SL4 is changed from high to low, both selection control lines SL0 and SL1 are high (timing t0). As shown in FIG. 10, the switch control at timing t0 is in a state in which both transistor switches TS0 and TS1 in the left side switch controller 12L are controlled ON and both transistor switches TS4 and TS5 in the switch controller 12C in the center are controlled OFF.

Meanwhile, state of transistor switches TS2 and TS3 in the right side switch controller 12R is not shown in FIG. 10. In this embodiment, although states of switch control on the side not to be refreshed are not restricted, a state in which both transistor switches TS2 and TS3 are controlled OFF is shown for convenience in the state connection diagrams in FIGS. 11 to 13.

FIG. 11 shows a connection state at timing t0. In FIG. 11, two areas 10L and 10R of the mat 10, rows of sense amplifiers 11L and 11R on the peripheral thereof and a circuit portion including the switch controllers 12L, 12R and 12C are schematically shown. The left side switch controller 12L is controlled so that in each sense amplifier SA, both bit lines BL0 and BL1 are connected to one input terminal and both bit lines BL2 and BL3 are connected to the other input terminal. And the switch controller 12C in the center is controlled so that bit lines of two areas 10L and 10R of the mat 10 are disconnected from each other. Thereby, each of all the bit lines BL in the area 10L are connected at only one side thereof to any of sense amplifiers SA in the left side row of sense amplifiers 11L.

In such a state, the pre-charge operation is performed for all the bit lines BL in the mat 10 all at once so as to supply a pre-charge voltage through the switch controller 12L by a pre-charge equalizer circuit (not shown) attached to the sense amplifier SA. This pre-charge voltage is assumed to be an intermediate voltage between power source voltage and ground voltage. At this time, as shown in FIG. 9, bit line equalize signal output from the pre-charge equalizing circuit is high. Thereafter, the bit line equalize signal changes to low and the pre-charge operation is completed.

Next, the refresh operation for the selected word line WL is performed in two cycles. First, as shown in FIG. 9, when the pre-charge operation is completed, the selection control line SL0 is switched from high to low to start the refresh operation of the first half (timing t1) As shown in FIG. 10, a state of switching control at timing t1 is that the transistor switch TS0 is controlled OFF and the transistor switch TS1 is controlled ON. Meanwhile, the transistor switches TS4 and TS5 of the switch controller 12C in the center are maintained OFF.

At timing t1, the connection state of FIG. 11 shifts to the connection state of FIG. 12. In FIG. 12, the word line to be refreshed of the mat 10 is included in the left side area 10L. The switch controller 12L is controlled so that a bit line pair composed of the odd number bit lines BL0 and BL2 is connected to each sense amplifiers SA in the row of sense amplifiers 11L. The switch controller 12C in the center maintains a state in which the bit lines BL in the two areas 10L and 10R are disconnected from each other like FIG. 11. Thereby, half of the bit lines BL in the area 10L are connected at only one side thereof to the sense amplifiers SA.

In such a state, as shown in FIG. 9, the selected word line WL to be refreshed rises to high to be activated. From memory cells MC located on the odd number bit lines BL0 and BL2 of the memory cells MC on the selected word line WL, their data is read out by each bit line pair to the left side row of sense amplifiers 11L. At this time, the signal levels of a bit line pair is amplified from minute level at the beginning by the sense amplifier SA as shown in FIG. 9. Thereafter, data read out from each sense amplifier SA is rewritten to an original memory cell MC.

Next, as shown in FIG. 9, the selection control line SL1 is switched from high to low temporarily so that the bit line equalize signal changes to high for a predetermined period with the left side row of sense amplifiers 11L disconnected from the area 10L. This is intended to protect data read out through the bit lines BL in the refresh cycle of the second half from being destroyed by supplying the pre-charge voltage to the wire of the input side of the row of sense amplifiers 11L.

Thereafter, the selection control line SL0 is switched from low to high to start the refresh operation of the second half (timing t2). As shown in FIG. 10, the switch control at timing t2 is in a state in which the transistor switch TS0 is controlled ON and the transistor switch TS1 is controlled OFF, and the state at timing t1 is inverted. Meanwhile, the transistor switches TS4 and TS5 of the switch controller 12C in the center are maintained OFF.

At timing t2, the connection state of FIG. 12 shifts to the connection state of FIG. 13. In FIG. 13, The switch controller 12L is controlled so that a bit line pair composed of the even number bit lines BL1 and BL3 is connected to each sense amplifiers SA in the row of sense amplifiers 11L. The switch controller 12C in the center maintains a state in which the bit lines BL in the two areas 10L and 10R are disconnected from each other like FIG. 11. Thereby, half of the bit lines BL which have been connected in the refresh cycle of the first half in the area 10L are disconnected while the other half of the bit lines BL which have not been connected in the refresh cycle of the first half are connected at only one side thereof to the sense amplifiers SA.

In such a state, as shown in FIG. 9, of memory cells MC on the word line WL being high, data of the memory cells located on the even number bit lines BL1 and BL3 is read out by each bit line pair to the left side row of sense amplifiers 11L. In this case, as in the same manner as the refresh cycle of the first half, after the signal levels of a bit line pair is amplified from minute level at the beginning by the sense amplifier SA, data read out from each sense amplifier SA is rewritten to an original memory cell MC. Thereafter, the selected word line WL falls to low and the refresh operation is completed. Subsequently, the bit line equalize signal and the selection control signal SL1 are switched to high and the pre-charge voltage is supplied to the bit line pair on the side of the sense amplifiers SA and to the bit line pair on the side of the area 10L, thereby returning to the state at the beginning.

In addition, a series of the operations described above can be also applied to a case in which a word line WL in the area 12R on the right side of the mat 10 is selected. In this case, the role of the row of sense amplifiers 11L and the switch controller 12L on the left side is exchanged with that of the row of sense amplifiers 11R and the switch controller 12R on the right side to assume symmetrical operations.

It is possible to achieve an effect of reducing current consumption in the refresh operation as described above by performing the two-cycle refresh operation. In this embodiment, since the configuration is employed in which the bit lines BL are disconnected by the switch controller 12C in the center to obtain divided two areas 10L and 10R, the length of the bit lines reduces by half compared to the normal configuration. Thus, capacitance of each bit line BL reduces by half, and then charge and discharge currents flowing to the memory cells MC through the bit lines BL also reduces by half. Further, since the reduction of the capacitance of each bit line BL by half causes the level of readout signal from the memory cells MC to increase, sense margin of the sense amplifiers SA can be increased. Consequently, the interval of the self refresh can be prolonged, and self refresh current of DRAM can be reduced by a combination of these effects.

In this case, if a configuration using the mats 10 with half size is employed from the beginning, the length of the bit lines BL reduces by half and the capacitance thereof reduces by half. However, this configuration doubles the number of mats 10, and thus the number of the rows of sense amplifiers is also doubled. Generally, the row of sense amplifiers has a large circuit scale, so the chip area overhead increases largely. On the other hand, only the switch controller 12C in the center is added to the configuration of this embodiment and the circuit scale is sufficiently smaller than the case of increasing the number of the rows of sense amplifiers, so the chip area overhead can be suppressed to achieve the above described effects.

The refresh operation based on the configuration of this embodiment has a remarkably large effect for self refresh performed at a predetermined interval during stand-by of DRAM. Generally, current consumption of DRAM mounted on the device for mobile use is determined depending on current necessary in the self refresh to hold data. Therefore, the current consumption of DRAM can be remarkably reduced by employing the configuration of this embodiment in which reduction of the charge and discharge currents of the bit lines BL and the prolongation of the interval of the self refresh are realized.

Here, regarding auto refresh in normal operation of DRAM, not only the effect to reduce the current consumption to some extent, but also an effect of access performance from a different viewpoint can be obtained. That is, in the refresh operation, since each bit line BL is divided by the switch controller 12C, a word line BL in each of areas 10L and 10R totaling two word lines BL are selected and the same refresh operation as described above can be performed in both areas 10L and 10R at the same time. In this case, if m word lines BL exist in the mat 10, m/2 refresh operations may be performed as a whole, and thus it is possible to reduce busy rate in the refresh operation without increasing the charge and discharge currents of the bit lines BL.

Meanwhile, regarding the DRAM of this embodiment, the configuration is described in which the switch controller 12C is arranged in the center of the mat 10 and the mat 10 can be divided into the two areas 10L and 10R each including the same number of word lines WL. However, a configuration is applicable, in which the switch controller 12C is arranged in the approximate (not exact) center of the bit lines BL in the extending direction thereof in the mat 10 and the mat 10 can be divided into two areas 10L and 10R each including slightly different number of word lines WL.

Further, regarding the DRAM of this embodiment, although the configuration including a plurality of mats 10 to which configurations of FIGS. 1 to 4 is applied, it can be realized that the configurations of FIGS. 1 to 4 are applied to the entire memory cell array or to one unit block of a plurality of unit blocks.

Although the content of the present invention has been described specifically according to this embodiment, the present invention is not restricted to the above-described embodiment but may be modified in various ways within a scope not departing from the spirit of the invention. The various configurations such as the shared sense amplifier system, the ¼ pitch cell array configuration, the ½ pitch cell array configuration, the row of sense amplifiers 11 and the switch controllers 12 have been mentioned in the embodiment. However, the present invention is not restricted to these methods or configurations, and the present invention can be applied widely to a variety of the semiconductor storage devices including open bit line cell array configuration or the like.

The present invention is not limited to the above described embodiments, and various variations and modifications may be possible without departing from the scope of the present invention.

This application is based on the Japanese Patent application No. 2005-104310 filed on Mar. 31, 2005, entire content of which is expressly incorporated by reference herein.

What is claimed is:

1. A semiconductor storage device, comprising:
    one or more unit blocks each including a plurality of memory cells formed at intersections between a plurality of word lines and a plurality of bit lines;
    a first row of sense amplifiers which is arranged on one side of said plurality of bit lines and includes a plurality of sense amplifiers for amplifying data of said plurality of memory cells through said plurality of bit lines in each said unit block;
    a second row of sense amplifiers which is arranged on an other side of said plurality of bit lines and includes a plurality of sense amplifiers for amplifying data of said plurality of memory cells through said plurality of bit lines in each said unit block;
    first switch means which switches a connection state between said one side of said plurality of bit lines and said first row of sense amplifiers;
    second switch means which switches a connection state between said other side of said plurality of bit lines and said second row of sense amplifiers;
    third switch means which is arranged in an approximate center of said plurality of bit lines in an extending direction thereof and switches a connection state in which one side and an other side of said plurality of bit lines is either connected or disconnected; and
    refresh control means which sets a state in which said plurality of bit lines is disconnected by said third switch means in refresh operation so as to divide said unit block into a first area on said one side of said plurality of bit lines and a second area on said other side thereof, controls said refresh operation using said first switch means and said first row of sense amplifiers when a selected word line to be refreshed is in said first area, and controls said refresh operation using said second switch means and said second row of sense amplifiers when said selected word line to be refreshed is in said second area.

2. A semiconductor storage device according to claim 1, wherein said refresh control means performs pre-charge operation for said plurality of bit lines and thereafter performs two-cycle refresh operation in which said plurality of bit lines is divided into half for each cycle using said first or second row of sense amplifiers.

3. A semiconductor storage device according to claim 1, wherein said memory cell array is configured using a shared sense amplifier system in which adjacent said unit blocks between which said first or second row of sense amplifiers is arranged share said first or second row of sense amplifiers.

4. A semiconductor storage device according to claim 1, wherein each of said first, second and third switch means includes a transistor switch controlled on/off by a selection control line connected to a gate thereof.

5. A semiconductor storage device according to claim 1, wherein each said sense amplifier included in said first and second rows of sense amplifiers has two input terminals for connecting a bit line pair composed of two bit lines, and said memory cell is formed at one of two intersections of said bit line pair on an arbitrary word line of said unit block.

6. A semiconductor storage device according to claim 5, wherein said memory cell array has a ¼ pitch cell array configuration,
    and of four adjacent bit lines, said first and second switch means switch a connection state of odd number bit lines and a connection state of even number bit lines respectively to said two input terminals of each said sense amplifier.

7. A semiconductor storage device according to claim 5, wherein said memory cell array has a ½ pitch cell array configuration,
    and of four adjacent bit lines, said first and second switch means switch a connection state of a bit line pair composed of adjacent two bit lines on one side and a connection state of a bit line pair composed of adjacent two bit lines on an other side respectively to said two input terminals of each said sense amplifier.

8. A semiconductor storage device according to claim 1, wherein said refresh control means controls so that said selected word line in said first area and said selected word line in said second area are both set to be refreshed, and a refresh operation using said first switch means and said first row of sense amplifiers and a refresh operation using said second switch means and said second row of sense amplifiers are performed at the same timing.

9. A semiconductor storage device according to claim 1, wherein each of said first and second areas includes half of said plurality of word lines in said unit block.

10. A semiconductor storage device according to claim 1, wherein said refresh control means controls self refresh operation at a predetermined interval to hold data during stand-by.

11. A semiconductor storage device, comprising:
    a plurality of memory cells formed at intersections between a plurality of word lines and a plurality of bit lines, the plurality of bit lines having first ends and second ends, respectively;
    a first row of sense amplifiers, coupled to the first ends of said plurality of bit lines, including a plurality of sense amplifiers for amplifying data of said plurality of memory cells through said plurality of bit lines;
    a second row of sense amplifiers, coupled to the second ends of said plurality of bit lines, including a plurality of sense amplifiers for amplifying data of said plurality of memory cells through said plurality of bit lines;
    a first switch unit configured for connecting said first ends of said plurality of bit lines with said first row of sense amplifiers;
    a second switch unit configured for connecting said second ends of said plurality of bit lines with said second row of sense amplifiers;
    a third switch unit disposed between the first and second ends of said plurality of bit lines for dividing the plurality of bit lines into first and second portions, respectively, and configured for connecting the first portions with the second portions, respectively; and
    a refresh control unit configured for controlling the third switch unit to disconnect the first portions from the second portions, respectively, in refresh operation, controlling said refresh operation using said first switch unit and said first row of sense amplifiers when a selected word line to be refreshed is associated with the first portions of the plurality of bit lines, and controlling said refresh operation using said second switch unit and said second row of sense amplifiers when said selected word line to be refreshed is associated with said second portions of the plurality of bit lines.

* * * * *